US009559051B1

(12) United States Patent
Xin et al.

(10) Patent No.: US 9,559,051 B1
(45) Date of Patent: Jan. 31, 2017

(54) METHOD FOR MANUFACTURING IN A SEMICONDUCTOR DEVICE A LOW RESISTANCE VIA WITHOUT A BOTTOM LINER

(71) Applicant: GLOBALFOUNDRIES INC., Grand Cayman (KY)

(72) Inventors: Yongchun Xin, Poughkeepsie, NY (US); Jang H. Sim, Hopewell Junction, NY (US); Junjing Bao, San Diego, CA (US); Zhigang Song, Hopewell Junction, NY (US); Yunsheng Song, Poughkeepsie, NY (US)

(73) Assignee: GlobalFoundries Inc., Cayman Islands (KY)

( * ) Notice: Subject to any disclaimer, the term of this patent is extended or adjusted under 35 U.S.C. 154(b) by 0 days.

(21) Appl. No.: 14/976,417

(22) Filed: Dec. 21, 2015

(51) Int. Cl.
*H01L 21/768* (2006.01)
*H01L 23/522* (2006.01)
*H01L 21/3205* (2006.01)
*H01L 21/3213* (2006.01)
*H01L 23/532* (2006.01)

(52) U.S. Cl.
CPC ..... *H01L 23/5226* (2013.01); *H01L 21/32055* (2013.01); *H01L 21/32137* (2013.01); *H01L 21/76804* (2013.01); *H01L 21/76844* (2013.01); *H01L 21/76846* (2013.01); *H01L 21/76873* (2013.01); *H01L 21/76874* (2013.01); *H01L 21/76876* (2013.01); *H01L 21/76879* (2013.01); *H01L 23/53238* (2013.01)

(58) Field of Classification Search
CPC ........... H01L 23/5226; H01L 21/32055; H01L 21/32137; H01L 21/76844; H01L 21/76804; H01L 21/76846; H01L 21/76873; H01L 21/76874; H01L 21/76876; H01L 21/76879; H01L 23/53238
See application file for complete search history.

(56) References Cited

U.S. PATENT DOCUMENTS

| 5,930,669 | A | * | 7/1999 | Uzoh ................ H01L 21/76844 |
| | | | | 257/E21.577 |
| 6,380,075 | B1 | | 4/2002 | Cabral |
| 7,163,896 | B1 | | 1/2007 | Zhu |
| 7,344,996 | B1 | | 3/2008 | Lang |
| 8,952,421 | B2 | | 2/2015 | Curatola et al. |
| 2006/0024953 | A1 | | 2/2006 | Papa Rao |
| 2014/0103398 | A1 | | 4/2014 | Curatola et al. |

* cited by examiner

*Primary Examiner* — Fei Fei Yeung Lopez
(74) *Attorney, Agent, or Firm* — DeLio, Peterson & Curcio, LLC; Peter W. Peterson

(57) ABSTRACT

A method for depositing a conductor in the via opening electronic structure removes the via bottom liner so that the conductor deposited in the via opening directly contacts the underlying conductive layer. The method includes depositing amorphous silicon over the dielectric layer and the liner layer on the via opening sidewalls and bottom. The amorphous silicon extends substantially over the entire via opening while leaving below a void within the via opening. The amorphous silicon over the via opening and on the via opening bottom and the liner layer on the via opening bottom are anisotropically etched to leave a layer of amorphous silicon over the dielectric layer and the via opening side walls. The amorphous silicon is then removed to form a via opening having a substantially open-bottom liner. The conductor is then deposited in the via opening and contacts the underlying conductive layer.

20 Claims, 3 Drawing Sheets

METHOD FOR MANUFACTURING IN A SEMICONDUCTOR DEVICE A LOW RESISTANCE VIA WITHOUT A BOTTOM LINER

BACKGROUND OF THE INVENTION

1. Field of the Invention

The present invention relates to semiconductor devices generally and in particular to a method for manufacturing a low resistance via without a bottom liner.

2. Description of Related Art

Semiconductor devices employ interconnect wiring structures having multiple levels of metal lines (wires) and dielectric layers (insulator). The lines may take the form of etched films on the dielectric surface, or embedded metal wires fabricated in trenches in the dielectric. A via is a vertical connection, usually circular or rectangular in cross-section, which electrically connects wires on different levels, above and below the via. During processing, an adhesion diffusion barrier liner layer is used to line the via openings to separate the conductive metal forming the via from the surrounding dielectric matrix in the same layer level. The adhesion diffusion barrier or liner layer is an important element for the successful operation of the semiconductor structure. It is frequently formed of a material, or materials that are impermeable to the materials that form the via electrical conductor, such as aluminum (Al) or copper (Cu). Its function is to provide adhesion and prevent the diffusion of the conductor material into the dielectric matrix material which would lead to electrical and structural problems. A suitable liner may be formed of titanium nitride (TiN).

When scaling down semiconductor device geometry, problems arise because of decreasing contact/via size for different metal layer connection. When the device geometry shrinks to be less than 10 nm, via resistance will be more important for performance of the device. Via resistance arises from two sources: 1) the main body of metal line (Cu), and 2) the liner layer at the bottom of the via. Due to much higher electrical resistivity of liner materials as compared to the copper lines, the liner layer at via bottom is a major contributor to the total via resistance.

It would be useful to thin down the liner or remove the liner completely at via bottom to reduce the via resistance. The prior art has not provided an effective way of achieving that, while still protecting the via sidewall and top liner.

SUMMARY OF THE INVENTION

Bearing in mind the problems and deficiencies of the prior art, it is therefore an object of the present invention to provide a method for manufacturing in a semiconductor device a low resistance via without a bottom liner.

It is another object of the present invention to provide a method for creating in a dielectric layer of a semiconductor device a via opening without a bottom liner.

A further object of the invention is to provide a method for making a via opening without a bottom liner that is self-aligning to avoid extra lithographic processing.

It is yet another object of the present invention to provide such a method that employs otherwise standard silicon processing, and is compatible with current semiconductor processes.

Still other objects and advantages of the invention will in part be obvious and will in part be apparent from the specification.

The above and other objects, which will be apparent to those skilled in the art, are achieved in the present invention which is directed to a method for forming an electronic structure comprising initially providing an electronic substrate having a dielectric layer, a conductive layer below the dielectric layer, a via opening in the dielectric layer extending through the dielectric layer to the conductive layer at a bottom thereof, and a liner layer covering side walls of the via opening and the conductive layer at the bottom of the via opening. The method then includes depositing amorphous silicon over the dielectric layer and the liner layer on the via opening sidewalls and bottom. The amorphous silicon extends substantially over the entire via opening while leaving below a void within the via opening. The method further includes anisotropically etching the amorphous silicon extending substantially over the via opening and on the via opening bottom and etching the liner layer on the via opening bottom, while leaving a layer of amorphous silicon over the dielectric layer and the via opening side walls. The method also includes removing the layer of amorphous silicon to form a via opening having a substantially open-bottom liner.

After deposition, the amorphous silicon over the dielectric layer may have a first vertical thickness, the amorphous silicon extending substantially over the entire via opening may have a second vertical thickness and the amorphous silicon on the via opening bottom may have a third vertical thickness. The amorphous silicon first vertical thickness may be greater than the sum of the amorphous silicon second and third vertical thicknesses.

The via opening may have side walls tapered from a larger diameter at an upper portion thereof to a smaller diameter at the bottom. After deposition, the amorphous silicon over the via opening side walls may have a fourth vertical thickness. The amorphous silicon fourth vertical thickness may be greater than the sum of the amorphous silicon second and third vertical thicknesses.

After deposition the amorphous silicon may completely cover the entire via opening, or may have a minor opening therethrough, while leaving the void below.

The method may further include depositing a conductor in the via opening, the conductor directly contacting the conductive layer at the bottom of the via opening.

The dielectric layer may be silicon oxide, polyimide or silicon nitride liner, the liner layer may be titanium or a titanium alloy, the conductive layer may be copper, and/or the conductor deposited in the via opening may be copper. The conductor may be deposited in the via opening by depositing a copper seed layer by PVD, CVD, electroless or electro-plating.

The method of claim 1 wherein the anisotropically etching may be by reactive Ion etching.

In a related aspect, the present invention is directed to an electronic structure comprising a dielectric layer, a conductive layer below the dielectric layer, a via opening in the dielectric layer extending through the dielectric layer to the conductive layer at a bottom thereof, and a liner layer covering side walls of the via opening and the conductive layer at the bottom of the via opening. A layer of amorphous silicon is disposed over the dielectric layer and the liner layer on the via opening sidewalls and bottom. The amorphous silicon extends substantially over the entire via opening while leaving below a void free of amorphous silicon within the via opening.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE EMBODIMENT(S)

In describing the embodiment(s) of the present invention, reference will be made herein to FIGS. 1-6 of the drawings in which like numerals refer to like features of the invention.

For silicon wafer semiconductor devices employing interconnect wiring structures having multiple levels of wires and dielectric insulator, the present invention implements a deposition and etch process to remove the via bottom liner thin film while protecting the liner film at the via side wall and top without additional lithographic processing.

Figure 1:
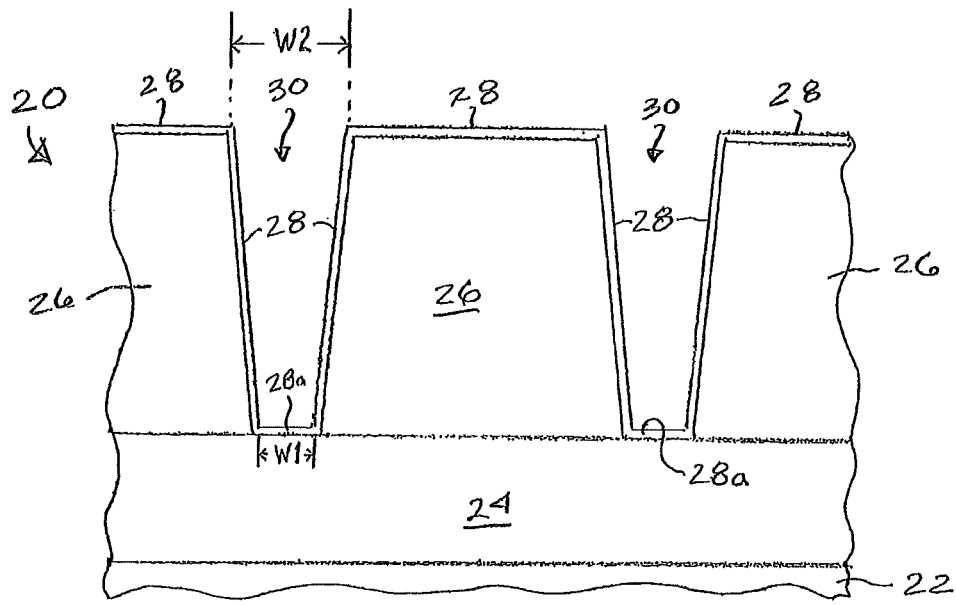
FIG. 1 is a cross-sectional elevational view of a portion of a semiconductor substrate during processing, showing via openings in a dielectric layer over a metal line or layer.

A typical multilayer device 20 in a silicon wafer is shown in vertical cross-section in FIG. 1 having lined vias in accordance with the present invention. A dielectric silicon substrate layer 22 has deposited thereover a metal line 24 or layer of other conductive material, which may be formed or otherwise embedded in a surrounding dielectric material (not shown) on the same level. Above the layer of having metal line 24 is another silicon dielectric layer 26, which has formed within it one or more via openings 30. The dielectric material may be a polyimide, silicon nitride, or silicon oxide layer, or any other desired dielectric material. The via openings extend from the upper surface of dielectric layer 26 to the underlying metal line 24. The via openings may be holes or trenches, and may be formed by standard lithographic processing of applying a photoresist layer, projecting on and exposing the photoresist layer with the desired via pattern, developing the layer, removing the resist layer from the desired via opening pattern areas, and etching the dielectric layer 26 with a suitable etchant though the resist openings to create the via openings. Other methods of making the via openings may be employed in the alternative.

Once the desired via openings are formed, an electrically conductive liner 28 is deposited on the base and side walls of the vias, and also typically on the upper surface of dielectric substrate 26. A widely used method for liner formation in the semiconductor industry is sputter deposition, which is a physical vapor deposition (PVD) technique. Sputter deposition occurs by the flow of metal atoms at low vapor pressure toward a target. Sputter deposition can be carried out in the semiconductor industry by a variety of techniques, i.e. conventional, collimated and ionized.

Another processing technique that is used for depositing a liner structure is chemical vapor deposition (CVD). The liner 28 material may be any suitable conductor, such as titanium nitride (TiN) or titanium. The method of depositing the liner may include heating the electronic substrate to, for example, 400° C., prior to the deposition step. The deposited liner may have a thickness of less than 5 nm on the sidewalls and bottom of the via openings. The via opening as shown in FIG. 1 has side walls tapered from a larger diameter W2 at an upper portion thereof to a smaller diameter W1 at the bottom. Once pre-processed in this manner, the electronic substrate has a dielectric layer on top, formed via openings in the dielectric layer, an exposed underlying conductive layer and a liner layer covering at least the via bottom and side walls. The invention is particularly directed to removal of most or all of the liner 28a at the via bottom, to leave the via with a substantially open-bottom liner.

Figure 2:
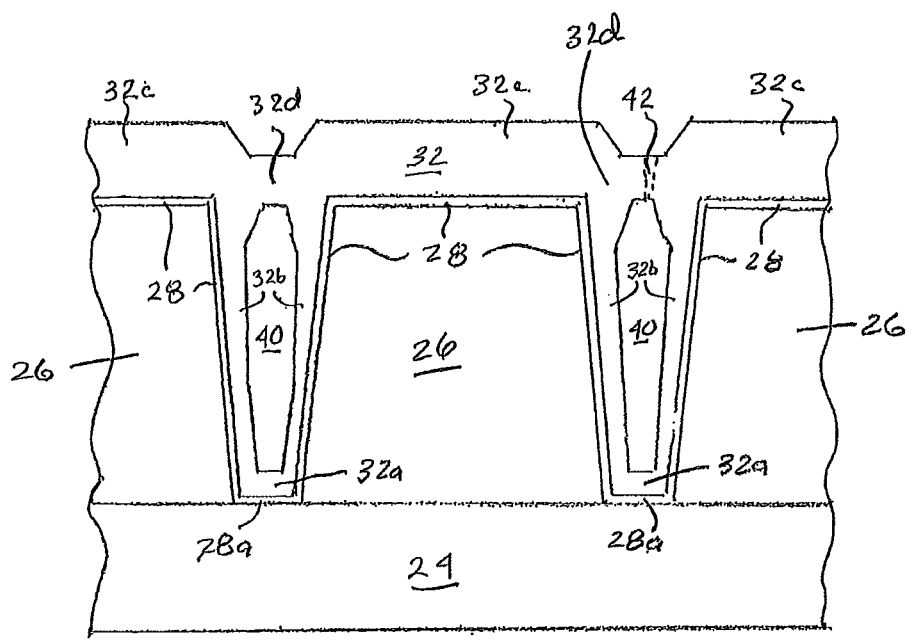
FIG. 2 is a cross-sectional elevational view of the semiconductor substrate portion of FIG. 1 after depositing the amorphous silicon layer in accordance with the invention.
Figure 3:
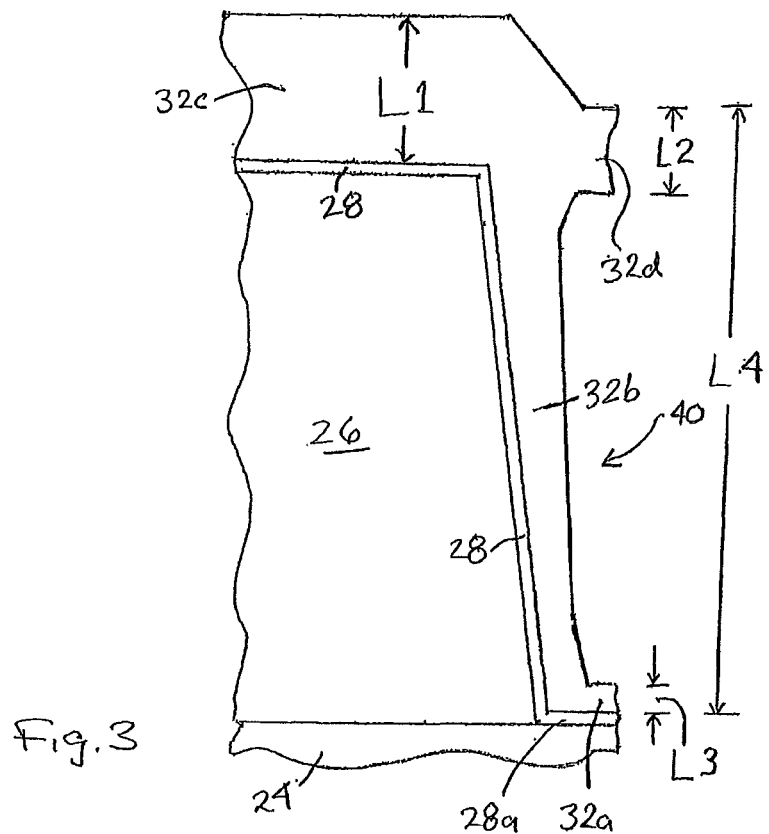
FIG. 3 is a close-up view of half of one of the vias in FIG. 2 showing the thicknesses of the deposited amorphous silicon layer.
Figure 4:
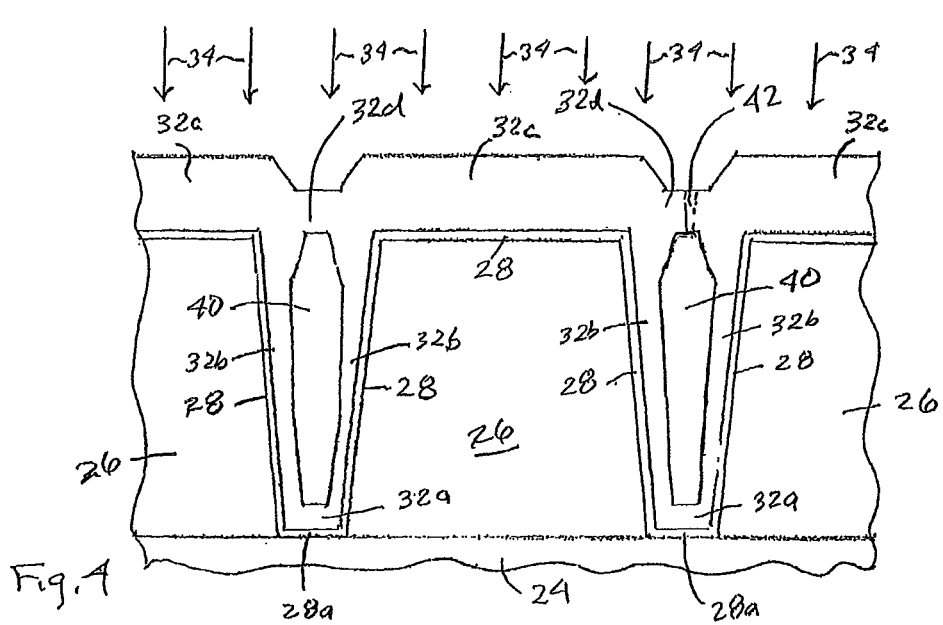
FIG. 4 is a cross-sectional elevational view of the semiconductor substrate portion of FIG. 2 showing the anisotropic etching of the deposited amorphous silicon layer in accordance with the invention.

In accordance with the invention, and as shown in FIGS. 2-4, amorphous silicon (a-Si) 32 is deposited over the dielectric layer 26 and the liner layer 28 on the via 30 opening sidewalls and bottom. However, the amorphous silicon is not deposited in a manner to provide a uniform thickness over the liner layer on dielectric layer and within the via opening. Instead, the amorphous silicon 32 is deposited so that it extends substantially over the entire via opening 30, while leaving below a void within the via opening. During the amorphous silicon deposition, because of pinch-off at the top of the via opening, a gapfill void is formed at the center of the via opening. In the example shown, the amorphous silicon layer includes a portion 32a that is deposited on the liner 28a at the via opening bottom, a portion 32b deposited on the liner on the via side opening walls, a portion 32c deposited over the liner on the upper surface of the dielectric substrate 26, and a portion 32d completely covering the upper opening of the via. Between the amorphous silicon portions 32a, 32b and 32d is a void or hollow portion 40 that is free of the amorphous silicon. A minor opening 42 may be present in amorphous silicon layer portion 32d over void 40.

Vertical dimensions of the various portions of the amorphous silicon layer 32 are shown in FIG. 3. The vertical thickness of amorphous silicon layer 32c over the liner layer above the substrate 26 is designated as L1, the vertical thickness of amorphous silicon layer 32d over the top of the via is designated as L2, the vertical thickness of amorphous silicon layer 32a over the liner layer 28a at the bottom of the via is designated as L3, and the vertical thickness of amorphous silicon layer 32b over the liner layer along the side walls of the via is designated as L4. In accordance with the invention, the vertical thickness of the amorphous silicon over the liner layer above the dielectric 26 is greater than the sum of the vertical thicknesses of the amorphous silicon layers over the top of the via and over the bottom of the via, i.e.:

$$L1 > L2 + L3$$

Likewise, the vertical thickness of the amorphous silicon over the liner layer along the side walls of the via is greater than the sum of the vertical thicknesses of the amorphous silicon layers over the top of the via second and over the bottom of the via. Furthermore, as shown in the drawing figures, the vertical thickness of the amorphous silicon over the liner layer along the side walls of the via is much greater than the vertical thickness of the amorphous silicon over the liner layer above the dielectric 26. Therefore, the relationship of the various amorphous silicon layer thicknesses may also be expressed as:

L4>>L1>L2+L3

The method of practicing the invention then removes the amorphous silicon in a manner that results in removal of some, most or all of the amorphous silicon extending over the via opening, some of the amorphous silicon extending over the liner on the top surface of the dielectric layer 26, some of the amorphous silicon extending over the side walls of the liner within the via and substantially all of the amorphous silicon extending over on the via opening bottom, while leaving a residual portion of the layer of amorphous silicon over the dielectric layer and the via opening side walls. This may be done by employing an anisotropic etchant 34 (FIG. 4) that etches primarily in the downward vertical direction, with less etching occurring in a horizontal direction. An example of such etchant, which may be effective against both the amorphous silicon and the liner material, is reactive Ion etching (RIE).

Figure 5:
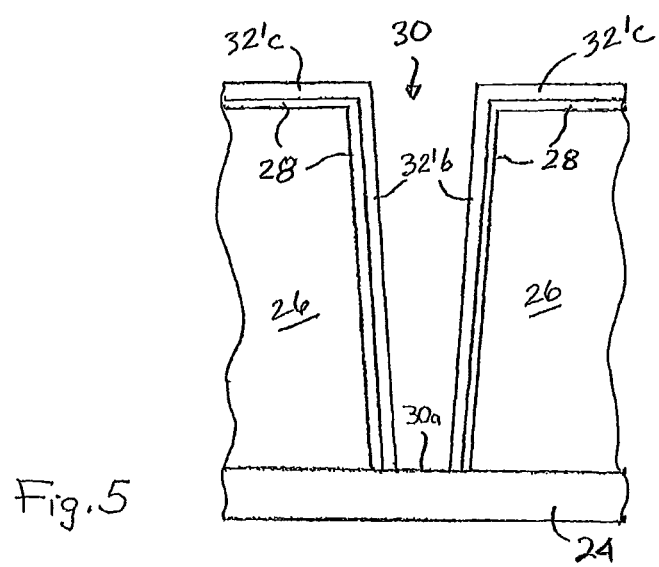
FIG. 5 is a close-up view of one of the vias in FIG. 4 after the anisotropic etching of the deposited amorphous silicon layer in accordance with the invention.
Figure 6:
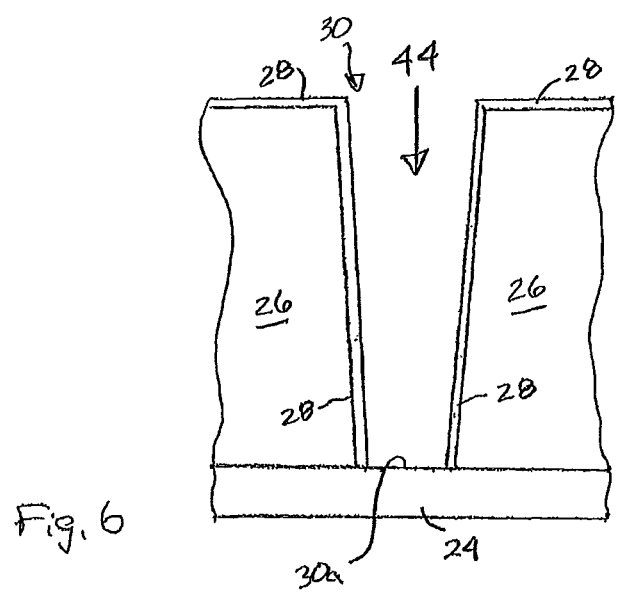
FIG. 6 shows the via of FIG. 5 after removal of the remaining amorphous silicon layer.

As the etchant is applied over and contacts the amorphous silicon, the vertical etchant 34 will first remove the thickness L2 of amorphous silicon layer 32d over the top of the via and then remove the thickness L3 of amorphous silicon layer 32a over the bottom of the via opening. Once the etchant removes the amorphous silicon at the via opening bottom, it then subsequently removes the liner material 28a at the bottom of the via opening, to expose the underlying metal 24. Once the etching has progressed to remove a sufficient amount of the via opening bottom liner to expose and clean the metal layer below the via opening, the etching is stopped. Because the thickness L4 of the amorphous silicon 32b over the via side walls and the thickness L1 of the amorphous silicon 32c above the substrate 26 are greater than the sum of the thicknesses L2 and L3 of the amorphous silicon 32d over the via top and the amorphous silicon 32a over the via bottom, respectively, the additional amorphous silicon thickness that remains there will protect the liner material and dielectric material over the via side walls from being etched, or etched through, as shown in FIG. 5. The initial deposition of the amorphous silicon thereby forms a self-aligned protect mask to protect liner layer at via sidewall and over the dielectric layer, and enable the removal of the bottom liner film.

The etch can also be performed in two steps. First, the etch is done to remove top amorphous-Si 32d at the via opening and the via bottom amorphous—Si 32a and keeping an amount of Si at the via side and top surface of dielectric 26. Then the second step of etching is selectively to remove the liner at bottom of the via.

The method of the invention may remove the via opening bottom liner only, and keep at least a partial layer of the liner over the via opening 30 side wall and atop the dielectric. The device 20 may then be subject to an etch process that removes the remaining amorphous silicon 32, without further substantial removal of the liner material 28. The via opening may then be filled with a conductive material to enable an electrical connection through dielectric layer 26 between the metal layer 24 and another conductive layer to be deposited on or above the dielectric layer.

A metal seed layer may be subsequently deposited on the exposed surface of the conductor layer at the bottom of the via opening. In a typical example, a thin layer of copper is deposited directly on a copper layer 24 which then functions as a seed layer for the subsequent CVD or electrodeposition of a thicker copper film. Subsequent deposition of copper films may be by any means, e.g., PVD, CVD, electroless, or electroplating, to fill the via opening. The liner along the via opening side walls and on top of the dielectric layer prevents the copper seed from touching the dielectric, and causing undesirable copper diffusion into the dielectric. At the via opening bottom, the copper seed is deposited directly on and contacts the copper line 24. Since there is no liner between copper line and copper via, the interconnect resistance is greatly reduced, since it is partially bonding to the surface-implanted Cu ions.

Thus, the invention achieves one or more of the objects above. The deposition processing forms a significant gapfill void within during amorphous silicon filling in the via opening. The process is self-aligning to avoid extra lithographic processing, and has a wide processing window and easy development on processing. The self-aligned amorphous silicon mask protects liner layer on the dielectric top and at the via side wall, and enable the easy removal of the via bottom liner film. It can be applied on different via layer processing, employs otherwise standard silicon processing, and is compatible with current semiconductor processes.

While the invention has been particularly described, in conjunction with a specific embodiment(s), it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for forming an electronic structure comprising the steps of:
   providing an electronic substrate having a dielectric layer, a conductive layer below the dielectric layer, a via opening in the dielectric layer extending through the dielectric layer to the conductive layer at a bottom thereof, and a liner layer covering side walls of the via opening and the conductive layer at the bottom of the via opening;
   depositing amorphous silicon over the dielectric layer and the liner layer on the via opening sidewalls and bottom, the amorphous silicon extending substantially over the entire via opening while leaving a void within the via opening;
   anisotropically etching the amorphous silicon extending substantially over the via opening and on the via opening bottom and etching the liner layer on the via opening bottom, while leaving a layer of amorphous silicon over the dielectric layer and the via opening side walls; and
   removing the layer of amorphous silicon to form a via opening having a substantially open-bottom liner.

2. The method of claim 1 wherein the amorphous silicon over the dielectric layer has a first vertical thickness, the amorphous silicon extending substantially over the entire via opening has a second vertical thickness and the amorphous silicon on the via opening bottom has a third vertical thickness, and wherein the amorphous silicon first vertical thickness is greater than the sum of the amorphous silicon second and third vertical thicknesses.

3. The method of claim 2 wherein the amorphous silicon over the via opening side walls has a fourth vertical thickness, and wherein the amorphous silicon fourth vertical thickness is greater than the sum of the amorphous silicon second and third vertical thicknesses.

4. The method of claim 1 wherein the amorphous silicon completely covers the entire via opening, while leaving the void below.

5. The method of claim 1 wherein the amorphous silicon extending substantially over the via opening has a minor opening therethrough.

6. The method of claim 3 wherein the via opening has side walls tapered from a larger diameter at an upper portion thereof to a smaller diameter at the bottom.

7. The method of claim 1 further including depositing a conductor in the via opening, the conductor directly contacting the conductive layer at the bottom of the via opening.

8. The method of claim 1 wherein the liner layer is titanium or a titanium alloy.

9. The method of claim 1 wherein the conductive layer is copper.

10. The method of claim 1 wherein the conductor deposited in the via opening is copper.

11. The method of claim 1 wherein the conductor is deposited in the via opening by depositing a copper seed layer by PVD, CVD, electroless or electro-plating.

12. The method of claim 1 wherein the anisotropically etching is by reactive Ion etching.

13. The method of claim 1 wherein the dielectric layer is silicon oxide, polyimide or silicon nitride.

14. A method for forming an electronic structure comprising the steps of:
   providing an electronic substrate having a dielectric layer, a conductive layer below the dielectric layer, a via opening in the dielectric layer extending through the dielectric layer to the conductive layer at a bottom thereof, and a liner layer covering side walls of the via opening and the conductive layer at the bottom of the via opening;
   depositing amorphous silicon over the dielectric layer and the liner layer on the via opening sidewalls and bottom, the amorphous silicon extending completely over the entire via opening while leaving a void within the via opening, wherein after deposition the amorphous silicon over the dielectric layer has a first vertical thickness, the amorphous silicon extending substantially over the entire via opening has a second vertical thickness and the amorphous silicon on the via opening bottom has a third vertical thickness, and wherein the amorphous silicon first vertical thickness is greater than the sum of the amorphous silicon second and third vertical thicknesses;
   anisotropically etching the amorphous silicon extending substantially over the via opening and on the via opening bottom and etching the liner layer on the via opening bottom, while leaving a layer of amorphous silicon over the dielectric layer and the via opening side walls; and
   removing the layer of amorphous silicon to form a via opening having a substantially open-bottom liner.

15. The method of claim 14 wherein the via opening has side walls tapered from a larger diameter at an upper portion thereof to a smaller diameter at the bottom.

16. The method of claim 15 wherein the amorphous silicon over the via opening side walls has a fourth vertical thickness, and wherein the amorphous silicon fourth vertical thickness is greater than the sum of the amorphous silicon second and third vertical thicknesses.

17. The method of claim 14 further including depositing a conductor in the via opening, the conductor directly contacting the conductive layer at the bottom of the via opening.

18. The method of claim 14 wherein the liner layer is titanium nitride.

19. The method of claim 1 wherein the conductive layer is copper and the conductor deposited in the via opening is copper.

20. An electronic structure comprising:
   a dielectric layer;
   a conductive layer below the dielectric layer;
   a via opening in the dielectric layer extending through the dielectric layer to the conductive layer at a bottom thereof;
   a liner layer covering side walls of the via opening and the conductive layer at the bottom of the via opening; and
   a layer of amorphous silicon over the dielectric layer and the liner layer on the via opening sidewalls and bottom, the amorphous silicon extending substantially over the entire via opening while leaving a void free of amorphous silicon within the via opening.

* * * * *